US008842485B2

(12) United States Patent
Murakami

(10) Patent No.: US 8,842,485 B2
(45) Date of Patent: Sep. 23, 2014

(54) DELAY CIRCUIT, DELAY CONTROLLER, MEMORY CONTROLLER, AND INFORMATION TERMINAL

(71) Applicant: Panasonic Corporation, Osaka (JP)

(72) Inventor: Daisuke Murakami, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/845,510

(22) Filed: Mar. 18, 2013

(65) Prior Publication Data

US 2013/0219115 A1      Aug. 22, 2013

Related U.S. Application Data

(63) Continuation of application No. PCT/JP2011/005884, filed on Oct. 20, 2011.

(30) Foreign Application Priority Data

Nov. 1, 2010   (JP) ................................. 2010-245714

(51) Int. Cl.
| | |
|---|---|
| *G11C 7/22* | (2006.01) |
| *H03K 5/14* | (2014.01) |
| *H03K 5/13* | (2014.01) |
| *G11C 7/10* | (2006.01) |

(52) U.S. Cl.
CPC ................ *G11C 7/1072* (2013.01); *H03K 5/14* (2013.01); *H03K 5/131* (2013.01)
USPC .......................................... 365/194; 365/193

(58) Field of Classification Search
USPC .................................................. 365/194, 193
See application file for complete search history.

(56) References Cited

U.S. PATENT DOCUMENTS

| | | | | |
|---|---|---|---|---|
| 5,963,074 | A | * | 10/1999 | Arkin ............................ 327/276 |
| 5,969,551 | A | | 10/1999 | Fujioka |
| 6,242,954 | B1 | | 6/2001 | Taniguchi et al. |
| 6,259,294 | B1 | | 7/2001 | Murakami et al. |
| 6,665,230 | B1 | | 12/2003 | Shrader et al. |

(Continued)

FOREIGN PATENT DOCUMENTS

| | | |
|---|---|---|
| JP | 09-046195 | 2/1997 |
| JP | 10-135801 | 5/1998 |

(Continued)

OTHER PUBLICATIONS

International Search Report issued Nov. 15, 2011 in International (PCT) Application No. PCT/JP2011/005884.

*Primary Examiner* — Huan Hoang
*Assistant Examiner* — Jay Radke
(74) *Attorney, Agent, or Firm* — Wenderoth, Lind & Ponack, L.L.P.

(57) ABSTRACT

A delay circuit of the present disclosure includes a first delay unit and a second delay unit which are connected in series and delay an input signal to generate a delayed signal. The first delay unit includes a first signaling pathway, and changes, based on a first delay control value, a first amount of delay to be provided to the input signal by switching signaling pathways for transmitting the input signal that are within the first pathway. The second delay unit includes a second signaling pathway, and changes, based on a second delay control value, a second amount of delay to be provided to the input signal without switching the second signaling pathway for transmitting the input signal.

9 Claims, 11 Drawing Sheets

(56) References Cited

U.S. PATENT DOCUMENTS

| | | | |
|---|---|---|---|
| 6,795,931 B1 * | 9/2004 | LaBerge | 713/401 |
| 7,366,862 B2 | 4/2008 | Nystuen et al. | |
| 7,394,302 B2 | 7/2008 | Shimazawa | |
| 7,412,616 B2 | 8/2008 | Matsui et al. | |
| 7,433,262 B2 * | 10/2008 | Vergnes et al. | 365/233.1 |
| 7,669,072 B2 * | 2/2010 | Vergnes et al. | 713/503 |
| 7,945,801 B2 | 5/2011 | Matsui et al. | |
| 8,593,191 B1 * | 11/2013 | Cooke | 327/158 |
| 2005/0047192 A1 | 3/2005 | Matsui et al. | |
| 2005/0068110 A1 * | 3/2005 | Hui et al. | 331/1 A |
| 2006/0132212 A1 | 6/2006 | Shimazawa | |
| 2008/0276112 A1 | 11/2008 | Matsui et al. | |

FOREIGN PATENT DOCUMENTS

| | | |
|---|---|---|
| JP | 10-336008 | 12/1998 |
| JP | 2000-122750 | 4/2000 |
| JP | 2000-165216 | 6/2000 |
| JP | 2005-056334 | 3/2005 |
| JP | 2005-78547 | 3/2005 |
| JP | 2006-172641 | 6/2006 |

* cited by examiner

DELAY CIRCUIT, DELAY CONTROLLER, MEMORY CONTROLLER, AND INFORMATION TERMINAL

CROSS REFERENCE TO RELATED APPLICATIONS

This is a continuation application of PCT International Application No. PCT/JP2011/005884 filed on Oct. 20, 2011, designating the United States of America, which is based on and claims priority of Japanese Patent Application No. 2010-245714 filed on Nov. 1, 2010. The entire disclosures of the above-identified applications, including the specifications, drawings and claims are incorporated herein by reference in their entirety.

FIELD

The present disclosure relates to delay circuits, delay controllers, memory controllers, and information terminals and, in particular, to a delay circuit which delays an input signal to generate a delayed signal.

BACKGROUND

Memory devices such as a Synchronous Dynamic Random Access Memory (SDRAM) and memory controllers for transmitting and receiving data to and from the memory devices employ a source synchronous scheme to transmit data in order to meet a demand for high-speed data transmission. In the source synchronous scheme, a strobe signal and data can be transmitted and received together.

When a memory controller receives data from a memory device in a system which uses the source synchronous scheme for data transmission, for example, timing between a strobe signal and data is adjusted so that the data can be received in a valid duration of the data based on the strobe signal.

In the timing adjustment, data valid duration, in which data can be stably received when a strobe signal is used to receive the data, is made shorter as a frequency for data transmission is higher. Furthermore, the timing needs to be flexibly adjusted, since the relationship between the data and the strobe signal changes due to process characteristics, temperature change, and voltage change.

Hence, a conventional data receiving circuit synchronizes timing between a strobe signal and data, using, for example, a delay element (See Patent Literature 1). Moreover, the conventional data receiving circuit allows the delay element to vary the amount of delay.

Typically, in order to find an amount of delay to be used for stable data transmission, the memory controller first sets an amount of delay, writes data to a memory device, and reads the data from the memory device. Then, the memory controller checks whether or not the read data corresponds to the written data to determine whether or not the set amount of delay can be used for data transmission. The memory controller repeats such operations to detect a window–that is a time period for the amount of delay–during which stable data transmission can be executed.

Moreover, in order to keep the above-determined amount of delay constant during an operation of the system, the memory controller always monitors, based on a phase of an internal clock, whether or not there is a change in an amount of delay to be used as a reference. Then, in the case where the change is found in the reference amount of delay, the memory controller reflects the change in an amount of delay to be used for the above-described timing adjustment.

In a typical delay element, however, a change in a delay setting value indicating a delay amount inevitably generates noise onto the output provided from the delay element. Hence, the delay setting value cannot be changed during transmission and reception of data. Thus, in the SDRAM, the delay setting value is changed when a refresh command is executed. This is because data is not transmitted or received during the execution (See Patent Literature 2). In such a system, the refresh command is executed only for every certain period. Even though the amount of delay changes during the period, the system cannot reflect the change in the delay setting value. The failure in reflection causes a problem in that a gap develops between the amount of delay for the delay element and the optimum amount of delay, which deteriorates stability of high-speed data transmission.

A conventional technique allows a delay setting value to be reflected not only during a refresh operation but also during a non-read operation, which is a write operation, as far as the delay element is used for reading (See PTL 2). Hence, the conventional technique can update more often the amount of delay for the delay element.

Another conventional technique discloses changing an amount of delay by adding a capacitance to a signaling pathway and switching between the validity and invalidity of the addition (See Patent Literature 3). Hence, the conventional technique can reduce noise which appears when the amount of delay is changed during the operation. Thus, the conventional technique can update the amount of delay during the operation, which allows the amount of delay to be updated more often.

CITATION LIST

Patent Literature

[PTL 1] U.S. Pat. No. 6,665,230
[PTL 2] U.S. Pat. No. 7,366,862
[PTL 3] Japanese Unexamined Patent Application Publication No. 2006-172641

SUMMARY

Technical Problem

In the case where a delay setting value is to be updated when no appropriate path is used, as seen in the technique in PTL 2, the technique poses a problem in that update timing needs to be detected based on where to use an appropriate path. Moreover, the technique in PTL 2 uses unpredictable timing, which is other than the timing of a refresh command, such as one with write transmission. Consequently, the technique faces a difficulty in securing timing for adjusting an amount of delay.

Hence, the technique in PTL 2 inevitably requires complex control.

Furthermore, in the technique in Patent Literature 3, a typical amount of delay to be adjusted is small. Hence, the technique in Patent Literature 3 faces a difficulty in securing a window which is wide enough for adjusting an amount of delay in a delay circuit to be used for transmission and reception of data.

One non-limiting and exemplary embodiment provides a delay circuit, a delay controller, a memory controller, and an information terminal which successfully update more often an amount of delay for a delay element, keep control thereof from becoming complex, and provide a window which is wide enough for adjusting an amount of delay.

Solution to Problem

A delay circuit according to an aspect of the present disclosure includes: a first delay unit and a second delay unit which are connected in series and delay an input signal to generate a delayed signal, wherein the first delay unit includes a first signaling pathway, and changes, based on a first delay control signal, a first amount of delay to be provided to the input signal by switching signaling pathways for transmitting the input signal that are within the first pathway, and the second delay unit includes a second signaling pathway, and (i) provides to the input signal an amount of delay which is a sum of a predetermined delay value and a second amount of delay, and (ii) changes the second amount of delay based on a second delay control signal without switching the second signaling pathway for transmitting the input signal.

In this structure, the delay circuit according to an implementation of the present disclosure includes a second delay unit which does not generate much noise on an output signal when an amount of delay changes. Hence, the delay circuit according to an implementation of the present disclosure can change the amount of delay of the second delay unit regardless of its operating status, which contributes to updating an amount of delay of a delay element more often and keeping the control of the delay circuit itself less complex. Furthermore, the delay circuit according to an implementation of the present disclosure can secure a window which is wide enough for adjusting an amount of delay thanks to the first delay unit. Even though generating noise on an output signal, the first delay unit has a wide window for adjusting delay.

The first delay unit may change, based on the first delay control signal, the number of gate devices aligned in series on the signaling pathways for transmitting the input signal that are within the first pathway by switching the signaling pathways, and the second delay unit may change, based on the second delay control signal, a second delay time by changing a size of capacitance to be added to the second signaling pathway.

A delay controller according to an aspect of the present disclosure includes: the delay circuit; a delay adjusting unit which generates the first delay control signal and the second delay control signal; and a processing unit which executes processing using the delayed signal generated by the delay circuit, wherein the delay adjusting unit may: update the first amount of delay and the second amount of delay by updating the first delay control signal and the second delay control signal in an invalid duration in which the processing unit does not execute the processing using the delayed signal; and update the second amount of delay by updating the second delay control signal in a valid duration in which the processing unit executes the processing using the delayed signal.

Thanks to this structure, the delay controller according to an implementation of the present disclosure can not only obtain a wide enough window for adjusting an amount of delay in the invalid duration, but also adjust an amount of delay in the valid duration.

In the valid duration, the delay adjusting unit may update the second delay control signal for a predetermined time interval.

Thanks to this feature, the delay controller according to an implementation of the present disclosure can adjust a speed for following the change in operating environment.

The delay controller may further include a delay detecting unit which detects a reference amount of delay that is an index of an amount of delay observed under a current operating environment of the delay controller, wherein, based on the reference amount of delay, the delay adjusting unit may generate the first delay control signal and the second delay control signal.

Thanks to this feature, the delay controller according to an implementation of the present disclosure can adjust an amount of delay to the optimum one, depending on an operating environment.

The delay adjusting unit may update the second delay control signal in the case where a difference between a new reference amount of delay detected by the delay detecting unit and an immediately preceding reference amount of delay detected when the second delay control signal is updated is greater than a predetermined value in the valid duration, the new reference amount of delay and the immediately preceding reference amount of delay being included in the reference amount of delay.

Thanks to this feature, the delay controller according to an implementation of the present disclosure can adjust how often an amount of delay is updated.

In the valid duration, the delay adjusting unit may: calculate a new first delay control signal and a new second delay control signal based on a new reference amount of delay detected by the delay detecting unit, the new first delay control signal being included in the first delay control signal, the new second delay control signal being included in the second delay control signal, and the new reference amount of delay being included in the reference amount of delay; update the second amount of delay by outputting the new second delay control signal to the second delay unit, in the case where the new first delay control signal is same as a current first delay control signal included in the first delay control signal; and leave the first amount of delay and the second amount of delay un-updated, in the case where the new first delay control signal is different from the current first delay control signal.

Thanks to this structure, the delay controller according to an implementation of the present disclosure can reduce the generation of noise on a delayed signal during the operation of the processing unit.

In the valid duration, the delay adjusting unit may: calculate a new first delay control signal and a new second delay control signal based on a new reference amount of delay detected by the delay detecting unit, the new first delay control signal being included in the first delay control signal, the new second delay control signal being included in the second delay control signal, and the new reference amount of delay being included in the reference amount of delay; update the second amount of delay by outputting the new second delay control signal to the second delay unit, in the case where the new first delay control signal is same as a current first delay control signal included in the first delay control signal; and update the first delay control signal and the second delay control signal whereas causing the processing unit not to execute the processing using the delayed signal, in the case where the new first delay control signal is different from the current first delay control signal.

Thanks to this feature, the delay controller according to an implementation of the present disclosure can update an amount of delay more often.

In the valid duration, the delay adjusting unit may update the first delay control signal and the second delay control signal whereas causing the processing unit not to execute the processing using the delayed signal, in the case where a difference between the new first delay control signal and the current first delay control signal is greater than or equal to a predetermined value.

Thanks to this structure, the delay controller according to an implementation of the present disclosure needs fewer suspensions of the processing on the processing unit.

A memory controller according to an aspect of the present disclosure reads data from a memory. The memory controller includes the delay controller, wherein the input signal is a strobe signal to be outputted from the memory, and the processing unit may retrieve data to be outputted from the memory using the delayed signal.

This feature can update the amount of delay of a delay element more often and keep control of the memory controller from becoming complex, which contributes to providing the memory controller with a wide enough window for adjusting an amount of delay.

An information terminal according to an aspect of the present disclosure includes a memory and the memory controller which reads the data from the memory.

This feature can update the amount of delay of a delay element more often and keep control of the memory controller from becoming complex, which contributes to providing the memory controller with a wide enough window for adjusting an amount of delay.

It is noted that the present disclosure can be implemented not only as the delay circuit, the delay controller the memory controller, and the information terminal but also as a delay control method and a memory control method, which have characteristic units included in the delay controller and the memory controller, in the form of steps and as a program to cause a computer to execute the characteristic steps. As a matter of course, the program may be distributed via a recording medium such as a CD-ROM and a transmission medium such as the Internet.

Furthermore, the present disclosure can be implemented as a large-scale integration (LSI) which achieves part or all the functions of the delay circuit, the delay controller, the memory controller, and the information terminal.

Advantageous Effects

The present disclosure can implement a delay circuit, a delay controller, a memory controller, and an information terminal which successfully update more often an amount of delay for a delay element, keep control thereof from becoming complex, and provide a window which is wide enough for adjusting an amount of delay.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS

Described hereinafter are embodiments of the present disclosure, with reference to the drawings. It is noted that the embodiments below are specific examples of the present disclosure. The numerical values, shapes, materials, constitutional elements, arrangement positions and connecting schemes of the constitutional elements, steps, and an order of steps all described in the embodiments are examples, and shall not be defined as they are. The present disclosure shall be defined only by claims. Hence, among the constitutional elements in the embodiments, those not described in an independent claim representing the most generic concept of the present disclosure are not necessarily required to achieve the objects of the present disclosure; however, such constitutional elements are introduced to implement a preferable form of the present disclosure.

Embodiment 1

A memory controller according to Embodiment 1 of the present disclosure includes a first delay unit which changes an amount of delay by switching between signaling pathways that transmit a signal, and a second delay unit which changes an amount of delay without switching between the signaling pathways that transmit a signal. Moreover, the memory controller according to Embodiment 1 of the present disclosure updates the amount of delay of the second delay unit during an operation. Such a feature contributes to updating the amount of delay more often and keeping the control thereof from becoming complex. Furthermore, with the combination of the first delay unit and the second delay unit, the memory controller according to Embodiment 1 of the present disclosure can implement a window which is wide enough for adjusting an amount of delay.

Figure 1:
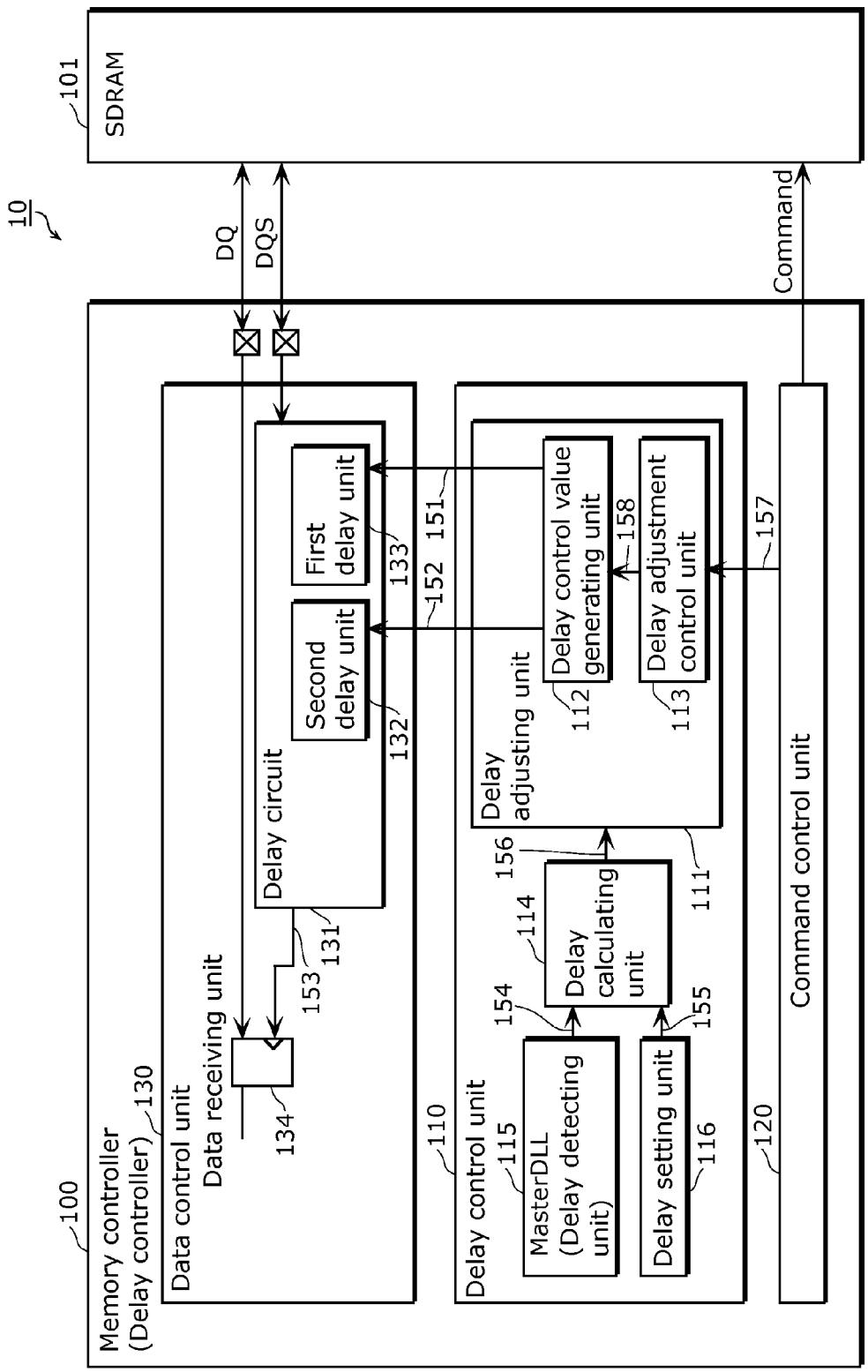
FIG. 1 depicts a block diagram of a memory system according to Embodiment 1 of the present disclosure.

FIG. 1 depicts a block diagram of a memory system 10 according to Embodiment 1 of the present disclosure. The memory system 10 in FIG. 1 includes a memory controller 100 (delay controller) and an SDRAM 101.

The memory controller 100 executes writing and reading of data to and from the SDRAM 101. The memory controller 100 includes a delay control unit 110, a command control unit 120, and a data control unit 130.

The data control unit 130 obtains read data and a strobe signal outputted from the SDRAM 101. The data control unit 130 also outputs, to the SDRAM 101, write data to be written to the SDRAM 101 and a strobe signal. The data control unit 130 includes a data receiving unit 134, and a delay circuit 131.

The delay circuit 131 delays a strobe signal DQS—that is an input signal—to generate a delayed signal 153. The delay circuit 131 includes a first delay unit 133 and a second delay unit 132.

The first delay unit 133 and the second delay unit 132 delay the strobe signal DQS to generate the delayed signal 153.

Moreover, the first delay unit 133 and the second delay unit 132 are connected in series with each other.

The first delay unit 133 includes a first signaling pathway. Based on a first delay control value 151 (first delay control signal), the first delay unit 133 changes a first amount of delay to be provided to the strobe signal DQS by switching signaling pathways for transmitting the strobe signal DQS that are included in the first signaling pathway.

The second delay unit 132 includes a second signaling pathway. Based on the second delay control value 152 (second delay control signal), the second delay unit 132 changes a second amount of delay to be provided to the strobe signal DQS without switching the second signaling pathway for transmitting the strobe signal DQS.

Figure 2A:
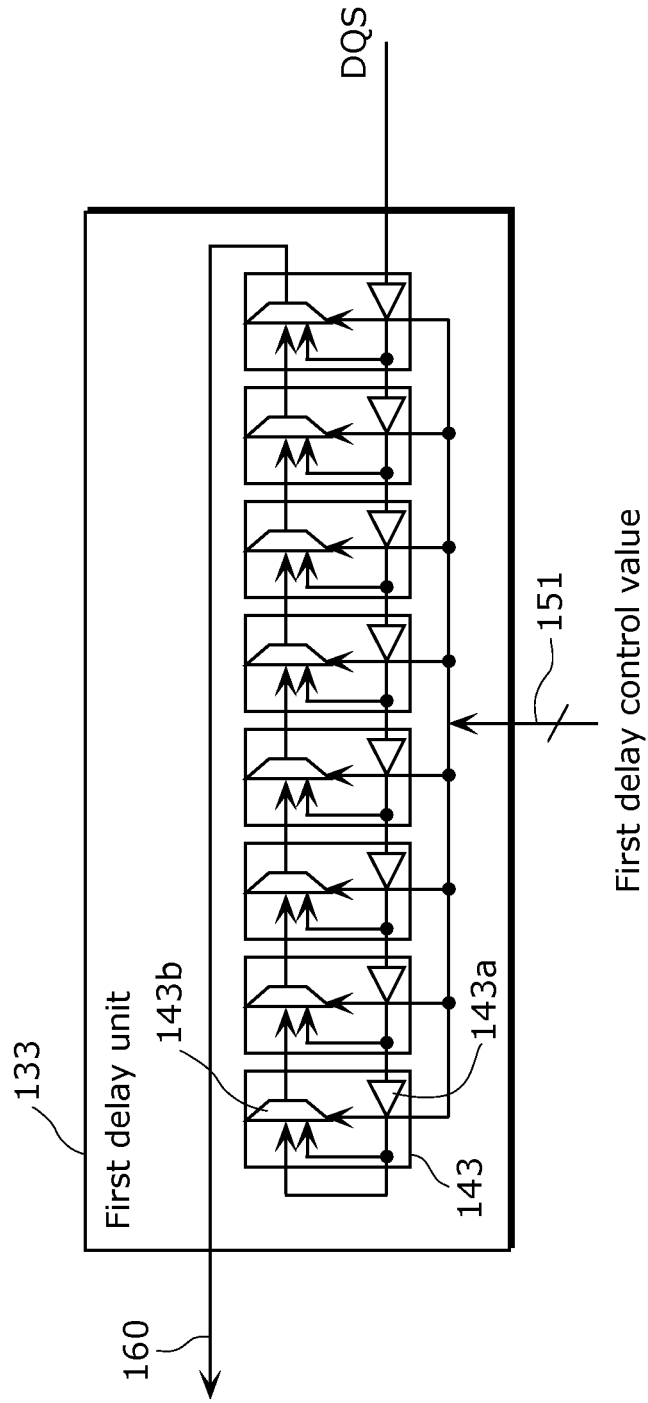
FIG. 2A depicts a circuit diagram of a first delay unit according to Embodiment 1 of the present disclosure.
Figure 2B:
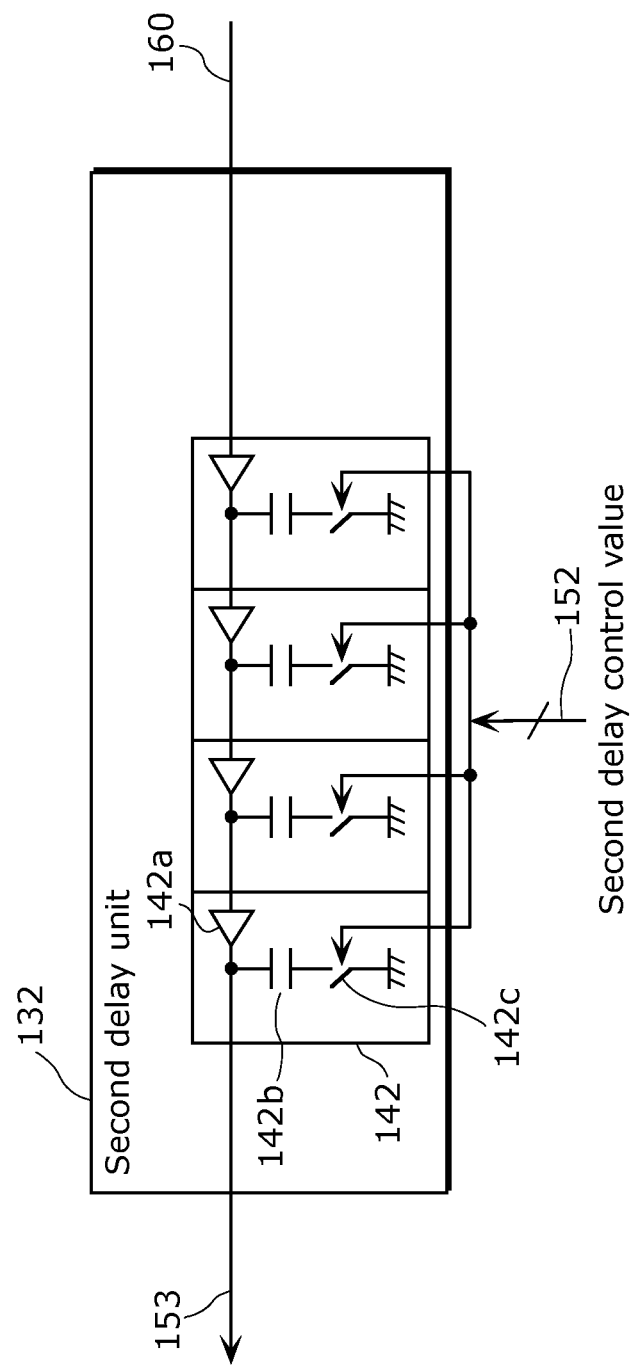
FIG. 2B depicts a circuit diagram of a second delay unit according to Embodiment 1 of the present disclosure.

FIG. 2A depicts a circuit diagram of the first delay unit 133. FIG. 2B depicts a circuit diagram of the first delay unit 132.

An exemplary case here is that the first delay unit 133 delays the strobe signal DQS to generate a delayed signal 160, and then the second delay unit 132 delays the delayed signal 160 to generate the delayed signal 153. However, any given sequence may be applicable when the first delay unit 133 and the second delay unit 132 provide the delay to the strobe signal DQS. In other words, the second delay unit 132 may delay the strobe signal DQS to generate the delayed signal 160, and then the first delay unit 133 may delay the delayed signal 160 to generate the delayed signal 153.

As shown in FIG. 2A, the first delay unit 133 includes multiple first delay elements 143. Each of the first delay elements 143 switches between the signaling pathways based on the first delay control value 151. Specifically, each first delay elements 143 includes a buffer 143a and a selector 143b. The first delay elements 143 are connected in series with each other.

An output terminal of each buffer 143a is connected to an input terminal of the buffer 143a in the succeeding stage. Two of input terminals of the selector 143b are each connected to the output terminal in the next stage and to the output terminal of the buffer 143a in the same stage. Here, for example, a signaling pathway is determined by (i) one of the selectors 143b selecting an output signal of the buffer 143a in the same stage, based on the first delay control value 151, and (ii) the other selectors 143b each selecting an output signal of the selector 143b in the next stage. Furthermore, the signaling pathways are switched by switching the above one selector 143b to another. Hence, the amount of delay of the first delay unit 133 is changed.

Thus, the first delay unit 133 can change a delay time for a pathway which is provided from an input terminal to an output terminal, by changing, based on the value of the first delay control value 151, the number of gate devices (buffers 143a) aligned in series on a signaling pathway for transmitting an input signal.

Furthermore, the second delay unit 132 includes multiple second delay elements 142. Based on a second delay control value 152, each of the second delay elements 142 switches between connection and disconnection of load capacitance provided to a signaling pathway.

Specifically, each second delay element 142 includes a buffer 142a, a capacitance 142b, and a switch 142c. The second delay elements 142 are connected in series with each other.

An output terminal of each buffer 142a is connected to an input terminal of the buffer 142a in the next stage. Moreover, the output terminal of each buffer 142a has a capacitance 142b and a switch 142c connected in series. Thus, when the switch 142c turns on, the capacitance 142b is added to the signaling pathway. Furthermore, the number of the switches 142c to be turned on may be changed depending on, for example, the second delay control value 152. Such a change changes the number of the capacitances 142b to be added to the signaling pathway.

Hence, the second delay unit 132 can change a delay time for a pathway which is provided from an input terminal to an output terminal, by changing, based on the value of the second delay control value 152, the size of the capacitance to be added to the signaling pathway.

Typically, the first delay unit 133 can change the delay time, using, as an adjustment time, a delay time required for a signal to pass through each buffer. The first delay unit 133 also switches between the signaling pathways. Hence, when the first delay control value 151 is changed while an input signal is changing, noise could appear to an output signal. Hence, the first delay control value 151 cannot be changed while an input signal is changing.

Moreover, as a change in the delay time, the second delay unit 132 uses a change, in the changing speed of a signal, caused by an added capacity. Hence, a unit of the delay time to be changed for the second delay unit 132 is smaller than that for the first delay elements 143. Moreover, the second delay unit 132 does not switch the signaling pathway, and thus can change the second delay control value 152 while an input signal is changing.

Here, as an example, suppose that the delay time of the first delay element 143 is four times as long as that of the second delay element 142. In other words, supposed here is the case where the first delay control value 151 and the second delay control value 152 are convertible to each other.

It is noted that the structures of the first delay unit 133 and the second delay unit 132 shall not be defined to the ones in FIGS. 2A and 2B as they are. In the above structures, for example, inverters may used instead of the buffers 142a and 143a. Similarly, the structures of the first delay element 143 and the second delay element 142 shall not be defined to the ones in FIG. 2A and 2B.

FIG. 1 shows only the data receiving unit 134; furthermore, the data control unit 130 may further includes a circuit for transmitting (writing) data to the SDRAM 101, and a delay circuit for delaying a command transmitted from the command control unit 120. For example, the delay circuit may have the same structure as that of the delay circuit 131.

The command control unit 120 creates a command and outputs the created command to control the SDRAM 101. When the command control unit 120 outputs a read command, for example, the SDRAM 101 outputs a strobe signal DQS, as well as outputs read data as a data signal DQ. Using the strobe signal DQS, the data control unit 130 receives the data signal DQ.

When the data control unit 130 receives read data, the strobe signal DQS is delayed by passing through each of the first delay unit 133 and the second delay unit 132. Hence, the delayed strobe signal DSQ, which is the delayed signal 153, is used by the data receiving unit 134. Specifically, the data receiving unit 134 receives the data signal DQ when the delayed signal 153 changes.

Here, the delay times to be added to the data signal DQ by the first delay unit 133 and the second delay unit 132 are determined by the first delay control value 151 and the second delay control value 152 each outputted from the delay control unit 110.

The delay control unit 110 controls the amount of delay generated by the delay circuit 131. The delay control unit 110 includes a delay adjusting unit 111, a delay calculating unit 114, a MasterDLL (Delay Locked Loop) 115, and a delay setting unit 116. The delay adjusting unit 111 includes a delay control value generating unit 112, and a delay adjustment control unit 113.

MasterDLL 115 (delay detecting unit) detects a reference amount of delay which is an index of an amount of delay observed under the current operating environment (such as power source voltage and temperature) of the memory controller 100. Specifically, as the reference amount of delay, the MasterDLL 115 always detects how many first delay elements 143 are required to implement a delay time which correspond to one clock cycle. The MasterDLL 115 outputs the number of the detected first delay elements 143 as a lock value 154.

The delay setting unit 116 holds, for example, a delay setting value 155 which is set outside. The delay setting value 155 indicates that a delay time to be generated by the delay circuit 131 is what percent of one clock cycle.

Based on the lock value 154 outputted by the MasterDLL 115 and the delay setting value 155 held in the delay setting unit 116, the delay calculating unit 114 calculates a request amount of delay 156, and outputs to the delay adjusting unit 111 the calculated request amount of delay 156. Specifically, the delay calculating unit 114 multiplies the lock value 154 by the delay setting value 155. When the lock value 154 is "101" and the delay setting value 155 is 25%, for example, the delay calculating unit 114 obtains "25.25" as the request amount of delay 156.

Depending on the request amount of delay 156 (the lock value 154), the delay adjusting unit 111 generates the first delay control value 151 and the second delay control value 152.

Moreover, during a refresh period in which the data receiving unit 134 is not operating, the delay adjusting unit 111 updates the amounts of delay for the first delay unit 133 and the second delay unit 132 by updating the first delay control value 151 and the second delay control value 152. Furthermore, even during a data receiving period in which data is read from the SDRAM 101, the delay adjusting unit 111 updates the amount of delay for the second delay unit 132 by updating the second delay control value 152.

Upon receiving a delay update allowance signal 157 from the command control unit 120, the delay adjustment control unit 113 outputs a delay control value generating instruction 158 to the delay control value generating unit 112.

When receiving the delay control value generating instruction 158, the delay control value generating unit 112 generates the first delay control value 151 and the second delay control value 152 based on the request amount of delay 156, and outputs to the delay circuit 131 the generated first delay control value 151 and the second delay control value 152. When the request amount of delay 156 is "25.25" as exemplified above, the delay control value generating unit 112 outputs "25" as the first delay control value 151 and "0.25" as the second delay control value 152.

Suppose the first delay control value 151 is "25". Among the selectors 143b included in the first delay unit 133, "1" is inputted to the selector 143b of the 25th first delay element 143, and "0" is inputted to the selectors 143b of the other first delay elements 143. Hence, twenty five buffers 143a are connected in series on the signaling pathway formed between an input terminal and an output terminal of the first delay unit 133.

Suppose the second delay control value 152 is "0.25". The switch 142c is controlled to add a capacitance 142b only to the second delay element 142 positioned first among the second delay elements 142, and to add no capacitance 142b to the other second delay elements 142. In Embodiment 1, the delay time of the first delay elements 143 is four times as long as that of the second delay element 142. Hence, the value "0.25" is equivalent to an amount of delay for one second delay element 142.

It is noted that the formats of the first delay control value 151 and the second delay control value 152 are one example, and the formats shall not be defined as they are. For example, each of the first delay control value 151 and the second delay control value 152 may be made of multiple bits, and one bit corresponds to one of the delay elements 143 and delay elements 142. Only one bit may be valid. Moreover, each of the first delay control value 151 and the second delay control value 152 may be made of multiple bits, and represented in the number of valid bits.

Furthermore, the command control unit 120 typically outputs the delay update allowance signal 157 during a refresh period in which the data receiving unit 134 is not operating and a data transmission period in which data is transmitted from the memory controller 100 to the SDRAM 101. It is noted that in the case where the delay circuit 131 is used for a data transmitting unit (not shown), a delay control value cannot be updated during the data transmission period. Hence, the command control unit 120 outputs the delay update allowance signal 157 only during the refresh period.

Described next is how the delay adjusting unit 111 works, with reference to FIG. 3.

Figure 3:
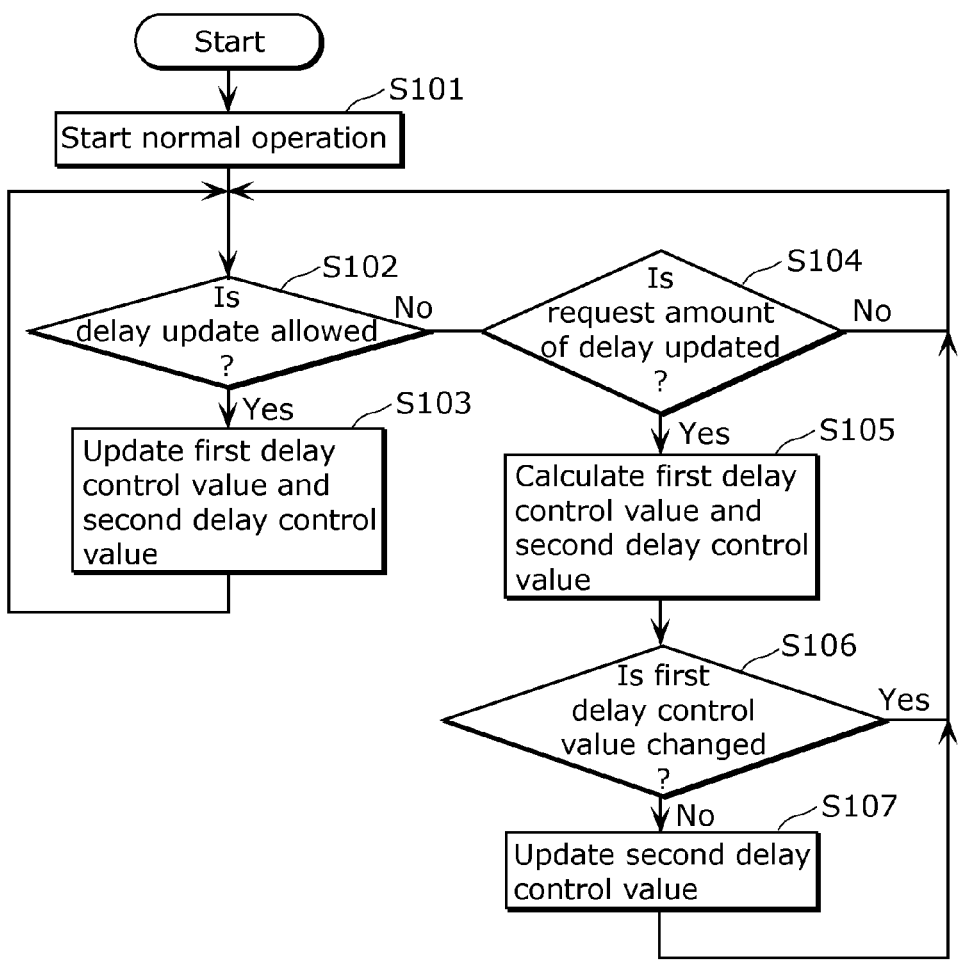
FIG. 3 depicts a flowchart showing an operation of adjusting an amount of delay according to Embodiment 1 of the present disclosure.

FIG. 3 depicts a flowchart showing an operation by the memory controller 100 adjusting an amount of delay.

First, the memory controller 100 starts a normal operation (S101). Here, the delay adjustment control unit 113 holds the request amount of delay 156 received from the delay calculating unit 114.

Next, the delay adjustment control unit 113 checks whether or not the delay update allowance signal 157 is outputted from the command control unit 120 (S102).

In the case where the delay update allowance signal 157 is outputted (S102: Yes), the delay adjustment control unit 113 outputs the delay control value generating instruction 158 to the delay control value generating unit 112. Upon receiving the delay control value generating instruction 158, the delay control value generating unit 112 generates the first delay control value 151 and the second delay control value 152, and outputs the generated first delay control value 151 and second delay control value 152 to the delay circuit 131 (S103).

In contrast, in the case where the delay update allowance signal 157 is not outputted (S102: No), the delay adjustment control unit 113 determines whether or not a new request amount of delay 156, currently being outputted by the delay calculating unit 114, differs from the request amount of delay 156 held in the delay adjustment control unit 113 itself (S104).

In the case where the new request amount of delay 156 is the same as the request amount of delay 156 held in the delay adjustment control unit 113 (S104: No), the delay adjustment control unit 113 repeats the processing from Step S102.

In contrast, the new request amount of delay 156 differs from the request amount of delay 156 held in the delay adjustment control unit 113 (S104: Yes), the delay control value generating unit 112 then calculates the first delay control value 151 and the second delay control value 152, using the new request amount of delay 156 (S105). It is noted that, here, the delay control value generating unit 112 still does not output to the delay circuit the calculated new first delay control value 151 and second delay control value 152.

Then, the delay control value generating unit 112 determines whether or not the calculated new first delay control value 151 differs from the first delay control value 151 currently being outputted (S106).

In the case where the new first delay control value 151 differs from the first delay control value 151 currently being outputted (S106: Yes), the delay adjustment control unit 113 does not update the first delay control value 151 and the second delay control value 152, and executes processing from the one in Step S102.

In contrast, in the case where the new first delay control value 151 is the same as the first delay control value 151 currently being outputted (S106: No); in other words, in the case where (i) the new first delay control value 151 is the same as the first delay control value 151 currently being outputted and (ii) a new second delay control value 152 differs from the second delay control value 152 currently being outputted, the delay control value generating unit 112 outputs the new second delay control value 152 to the second delay unit 132 (S107).

Described below are exemplary calculations executed in Steps S103 and S105. For example, when the lock value 154 is "101" and the delay setting value 155 is "25%" as described above, the request amount of delay 156 is "25.25". Here, the first delay control value 151 is "25", and the second delay control value 152 is "0.25".

Then, in the first delay unit 133, only the selector 143b of the 25th first delay elements 143 receives "1". Thus, the signaling pathway is set to run through 25 of the buffers 143a. Moreover, in the second delay unit 132, only the first capacitance 142b is valid. Hence, one fourth of the amount of delay for one first delay element 143 is set for the second delay unit 132.

Next, in the case where the lock value changes to "102" (S104: Yes), the delay calculating unit 114 outputs in Step S105 the request amount of delay 156 of "25.50". Hence, the delay control value generating unit 112 generates a new first delay control value 151 of "25" and a new second delay control value 152 of "0.50". Here, the delay control value generating unit 112 still does not output to the delay circuit 131 the generated first delay control value 151 and second delay control value 152.

Next, the delay control value generating unit 112 checks that the first delay control value 151 is left "25" and not changed from the original one (S106: No), and outputs to the second delay unit 132 the second delay control value 152 updated to "0.5". Hence, in the second delay unit 132, the first and second capacitances 142b become valid. Consequently, a half of the amount of delay for one first delay element 143 is set for the second delay unit 132.

Furthermore, for example, when the lock value 154 is "105", the first delay control value 151 is "26" and the second delay control value 152 is "0.25". Since the first delay control value 151 is changed from the original one "25" (S106: Yes), the delay control value is not updated. Thus, the processing from S102 is repeated.

Even though the delay update allowance signal 157 is not outputted (other than the refresh period), the memory controller 100 according to Embodiment 1 of the present disclosure updates, as described above, the amount of delay of the second delay unit 132 in the case where the first delay control value 151 is not updated. Here, the circuit structure of the second delay unit 132 is less subject to generating noise on an output signal even though there is a change in amount of delay. Hence, the memory controller 100 according to Embodiment 1 of the present disclosure can update amount of delay more often without generating noise.

Thus, the memory controller 100 according to Embodiment 1 of the present disclosure can adjust an amount of delay without stopping data transfer while an application of a system is running. Consequently, the memory controller 100 according to Embodiment 1 of the present disclosure can execute high-precision timing adjustment for fast and stable data transfer without any effects on an application to be executed in real time.

Furthermore, the memory controller 100 according to Embodiment 1 of the present disclosure can secure a window which is wide enough for adjusting an amount of delay thanks to the first delay unit 133. Even though generating noise on an output signal, the first delay unit 133 has a wide window for adjusting delay.

Described next is how a delay control value and a delay time actually change, with reference to FIG. 4.

Figure 4:
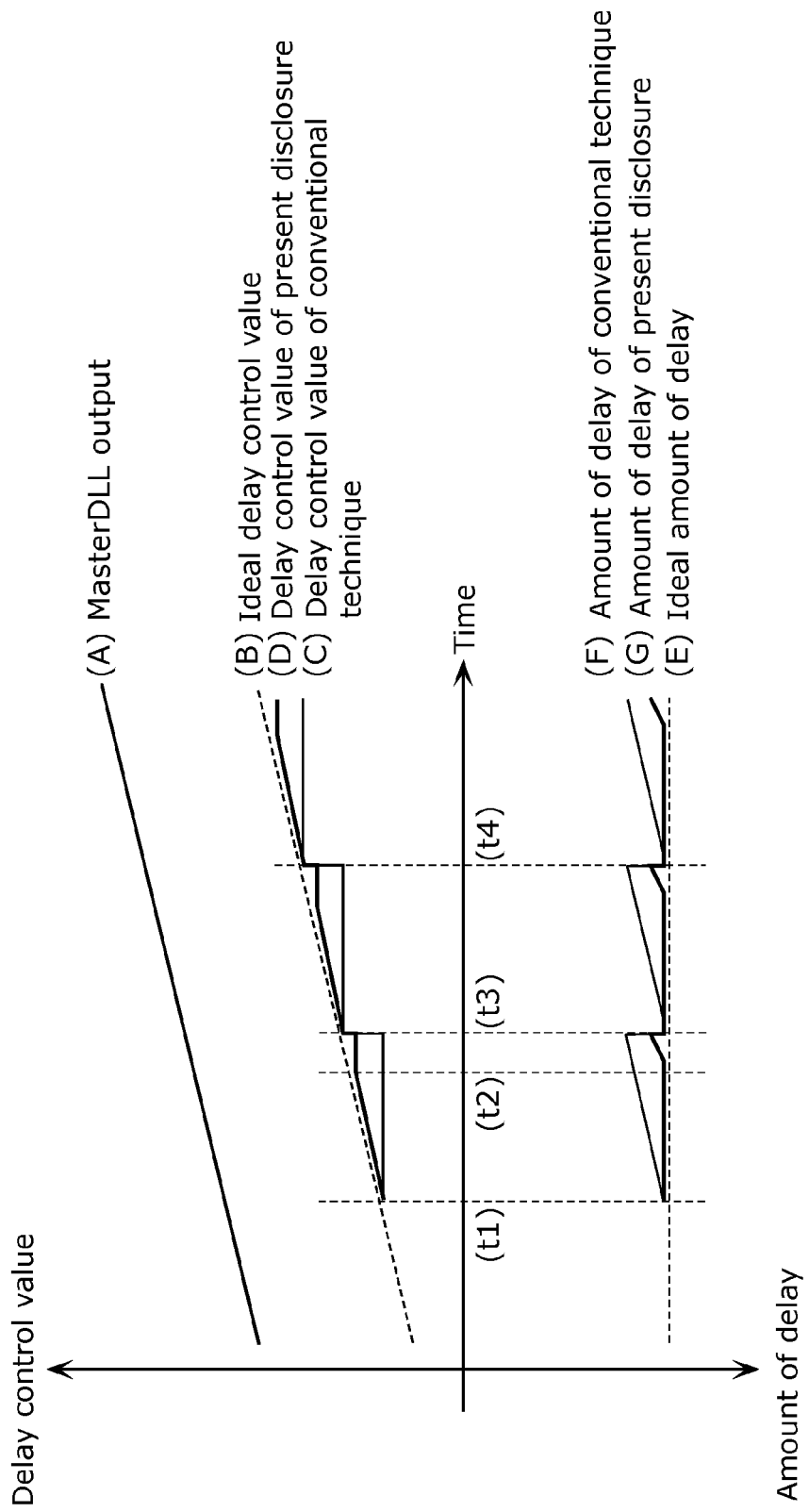
FIG. 4 shows an exemplary operation of a memory controller according to Embodiment 1 of the present disclosure.

FIG. 4 exemplifies the case where a voltage rises over time. When the voltage rises, a delay time for a buffer becomes short and the lock value 154 becomes larger. The line (A) shows the change in the lock value 154. The line (B) shows the request amount of delay 156 with respect to the line (A). Moreover, the request amount of delay 156 is a value which incorporates the lock value 154 at each time. Hence, the request amount of delay 156 and an ideal delay control value at each time are the same value. The line (E) shows a delay time which corresponds to the delay control value. The illustration (C) shows the change in the delay control value in the case of a conventional technique where the delay control value changes only when the delay update allowance signal 157 is outputted. The line (F) shows the change in the delay time at that time. Described hereinafter are a change in the delay control value (D) in the present disclosure, and a change in a delay time (G) at that time.

First, the delay update allowance signal 157 is outputted at a time 1. Hence, both the first delay control value 151 and the second delay control value 152 are updated. Thus, both a delay control value (C) of a conventional technique and a delay control value (D) of the present disclosure match an ideal delay control value (B). This processing corresponds to the one in Steps S102 and S103 in FIG. 3. Next, in the period between the time t1 and a time t2, no delay update allowance signal 157 is outputted. Here, in the conventional technique, the delay control value is not updated and remains constant. In contrast, in the present disclosure, the delay control value changes as far as the delay control value allows the second delay unit 132 to adjust the amount of delay. In other words, in the change period, the ideal delay control value (B) and the delay control value (D) of the present disclosure correspond to each other, since the processing is executed in accordance with the flow in FIG. 3. Moreover, this processing corresponds to the one in Steps S104 through S107 in FIG. 3.

Next, at the time t2, the ideal delay control value (B) reaches the delay control value for an amount of delay which the second delay unit 132 can adjust. In other words, the amount of delay of the first delay unit 133 needs to be changed. Hence, the memory controller 100 stops updating the delay control value. Thus, the delay control value becomes constant. Consequently, the delay control value (D) of the present disclosure does not match the ideal delay control value (B) only between the time t2 and the time t3. This processing corresponds to the one between Steps S104 and S106 in FIG. 3.

Next, at a time t3, the next delay update allowance signal 157 is outputted, and a delay control value (C) in the conventional technique and the delay control value (D) of the present disclosure match the ideal delay control value (B). Moreover, this processing corresponds to the one in Steps S102 and S103 in FIG. 3.

Furthermore, the same processing executed between the time t1 and the time t3 is also executed between the time t3 and a time t4.

By repeating the above processing, the memory controller 100 of the present disclosure can control an amount of delay of the delay circuit 131 when the voltage rises over time, so that the amount of delay reaches closer to the ideal amount of delay than an amount of delay in the conventional technique does. Hence, compared with the conventional technique, the memory controller 100 of the present disclosure can improve stability in high-speed data transmission and reception.

Figure 5:
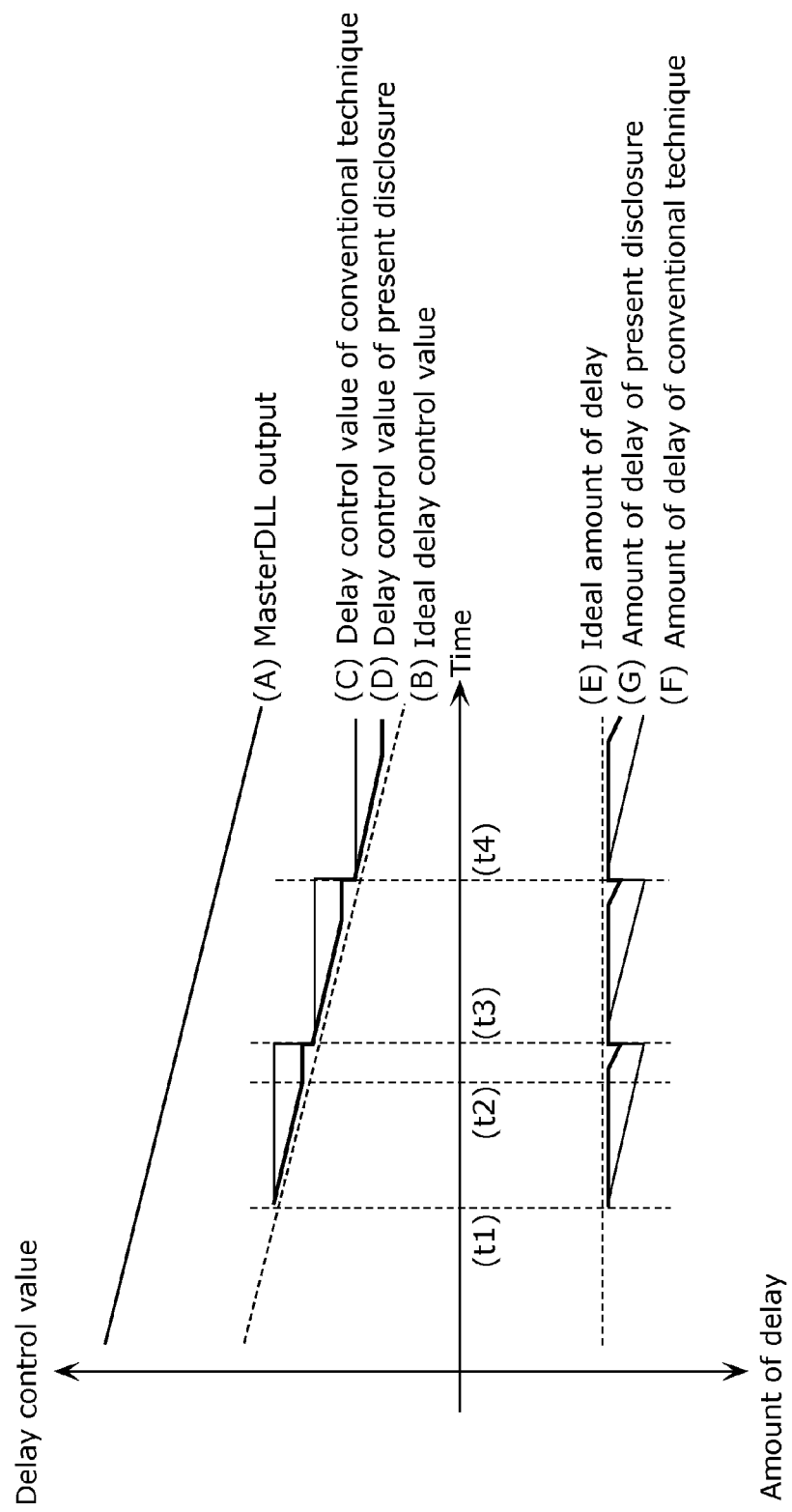
FIG. 5 shows an exemplary operation of the memory controller according to Embodiment 1 of the present disclosure.

FIG. 5 shows an exemplary operation of the memory controller 100 when a voltage falls over time. It is noted that the details of the operation are similar to those in FIG. 4, and shall be omitted.

Hence, the memory controller 100 according to Embodiment 1 of the present disclosure can cause an amount of delay of the delay circuit 131 to follow an ideal amount of delay, even though the voltage changes over time. Such a feature allows the memory controller 100 to implement more stable high-speed data transfer.

Exemplified here is the case where the voltage changes over time; however, the memory controller 100 can also achieve the above features when the lock value 154 changes due to other reasons, such as a temperature change.

In addition, Embodiment 1 exemplifies the case where the delay time of the first delay element 143 is four times as long as that of the second delay element 142. In other words, Embodiment 1 shows that the second delay unit 132 can add, to a signal, an amount of delay for four second delay elements 142—that is an amount of delay for one first delay element 143.

In contrast, the second delay unit 132 may includes a second delay element 142 which can implement an amount of delay for one or more first delay elements 142. For example, the second delay unit 132 may include 8 second delay elements 142. Compared with the 4 second delay elements 142, the 8 second delay elements 142 can express a larger delay control value even between the time t2 and the time t3 in FIG. 4. Such a feature can prevent a delay control value from being a constant one due to the stop of updating the delay control value of the second delay unit 132. Consequently, an ideal delay control value can be obtained.

Even though not enough number of the second delay elements 142 can be obtained, the period between the time t2 and the time t3 in FIG. 4 can be reduced. Hence, a more ideal delay control value can be obtained. Such a feature contributes to a stable operation.

Suppose the case where there are enough second delay elements 142 to implement an amount of delay for one or more first delay elements 142—that is there are 8 second delay elements 142, for example. Here, an offset value may be set for the second delay control value to be determined in Step S103 in FIG. 3. This can prevent the second delay control value from being a constant one. Consequently, an ideal delay control value can be obtained.

For example, instead of setting the second delay control value to "4" in Step S103, an offset "4" is added to the original second delay control value. Hence, the second delay control value is set to "8". Instead, the delay control value of the first delay unit 133 is reduced "1". Hence, the second delay control value becomes "0" between the times t2 and t3 in FIG. 5. Such a feature can prevent the case where the update of the delay control values stops because the second delay value cannot be reduced any further.

It is noted that the offset value does not have to be the amount of delay for one first delay element 143; instead, the offset value may be that for one or more first delay elements 143. The offset value successfully reduces or eliminates the period between the times t2 and t3. Hence, a more ideal delay control value can be obtained, and a stable operation can be implemented.

Furthermore, the amount of delay may be set to follow either only an increasing delay control value or only a decreasing delay control value. In contrast, a limitation may be set for the amount of delay to follow, so that fewer second delay elements 142 can be used for the second delay unit 132.

In the above description, a delay amount for 4 second delay elements 142 equals to that for 1 first delay elements 143; instead, the ratio may be other than 4 to 1.

Furthermore, in Step S104 in FIG. 3, the change in the lock value 154 may be checked for a time interval, instead of being checked immediately. In other words, in the case where the delay update allowance signal 157 is not outputted (S102: No), the delay adjusting unit 111 may update the second delay control value 152 for a predetermined time interval. Hence, providing enough time for determining processing makes it possible to adjust a speed for following the change in the lock value 154.

Moreover, instead of checking the change in the lock value 154 for a time interval, Step S105 may be executed when the difference between a new request amount of delay 156 and a held request amount of delay 156 becomes greater than or equal to a certain value.

Figure 6:
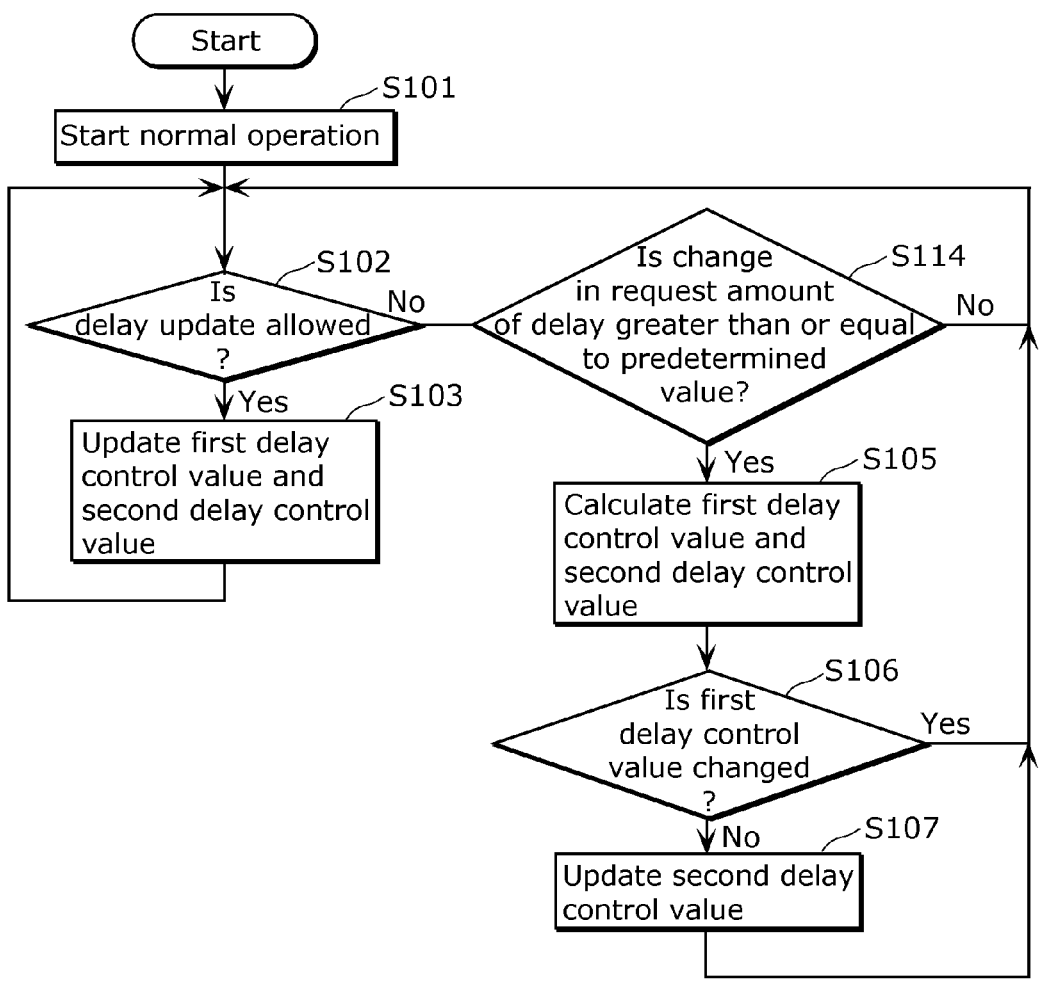
FIG. 6 depicts a flowchart showing a modification of the operation of adjusting an amount of delay according to Embodiment 1 of the present disclosure.

FIG. 6 depicts a flowchart showing an operation by the memory controller 100 adjusting an amount of delay. The comparison between the processing in FIG. 6 and FIG. 3 shows that the processing in Step S114 differs from the one in Step S104. Specifically, in Step S114, the delay adjustment control unit 113 determines whether or not the difference between a new request amount of delay 156 which the delay calculating unit 114 is currently outputting and a request amount of delay 156 held in the delay adjustment control unit 113 itself is greater than or equal to a predetermined value. In the case where the difference between the new request amount of delay 156 and the request amount of delay 156 held in the delay adjustment control unit 113 itself is smaller than the predetermined value (S114: No), the delay adjustment control unit 113 repeats the processing from one in Step S102.

In contrast, in the case where the difference between new request amount of delay 156 and the request amount of delay 156 held in the delay adjustment control unit 113 itself is greater than or equal to the predetermined value, (S114: Yes), the delay control value generating unit 112 next generates the first delay control value 151 and the second delay control value 152, using the new request amount of delay 156 (S105).

The above-described memory controller 100 shall not be defined as the one to be connected with the SDRAM 101; instead, the memory controller 100 may be applicable to another memory controller to be connected with another kind of memory. Moreover, the present disclosure does not depend on a board to be implemented or a package.

The above description shows an exemplary case where the delay circuit 131 and the delay control unit 110 of the present disclosure are applied to memory control; instead, the delay circuit 131 and the delay control unit 110 may be applied to a use other than the memory control. In other words, the present disclosure is applicable to a delay controller for controlling delay. For example, the present disclosure is applicable to the case when high-precision delay control is required, such as a circuit for data transmission and reception. Moreover, in such a delay controller, the above data receiving unit 134 can be replaced with a processing unit which executes processing based on a delayed signal 153 generated by the delay circuit 131. The refresh period can be replaced with an invalid duration in which the processing unit does not execute the processing based on the delayed signal 153. The data receiving period can be replaced with a valid duration in which the processing unit executes processing based on the delayed signal 153.

Embodiment 2

Embodiment 2 of the present disclosure shows a modification of the memory controller 100 according to Embodiment 1.

Figure 7:
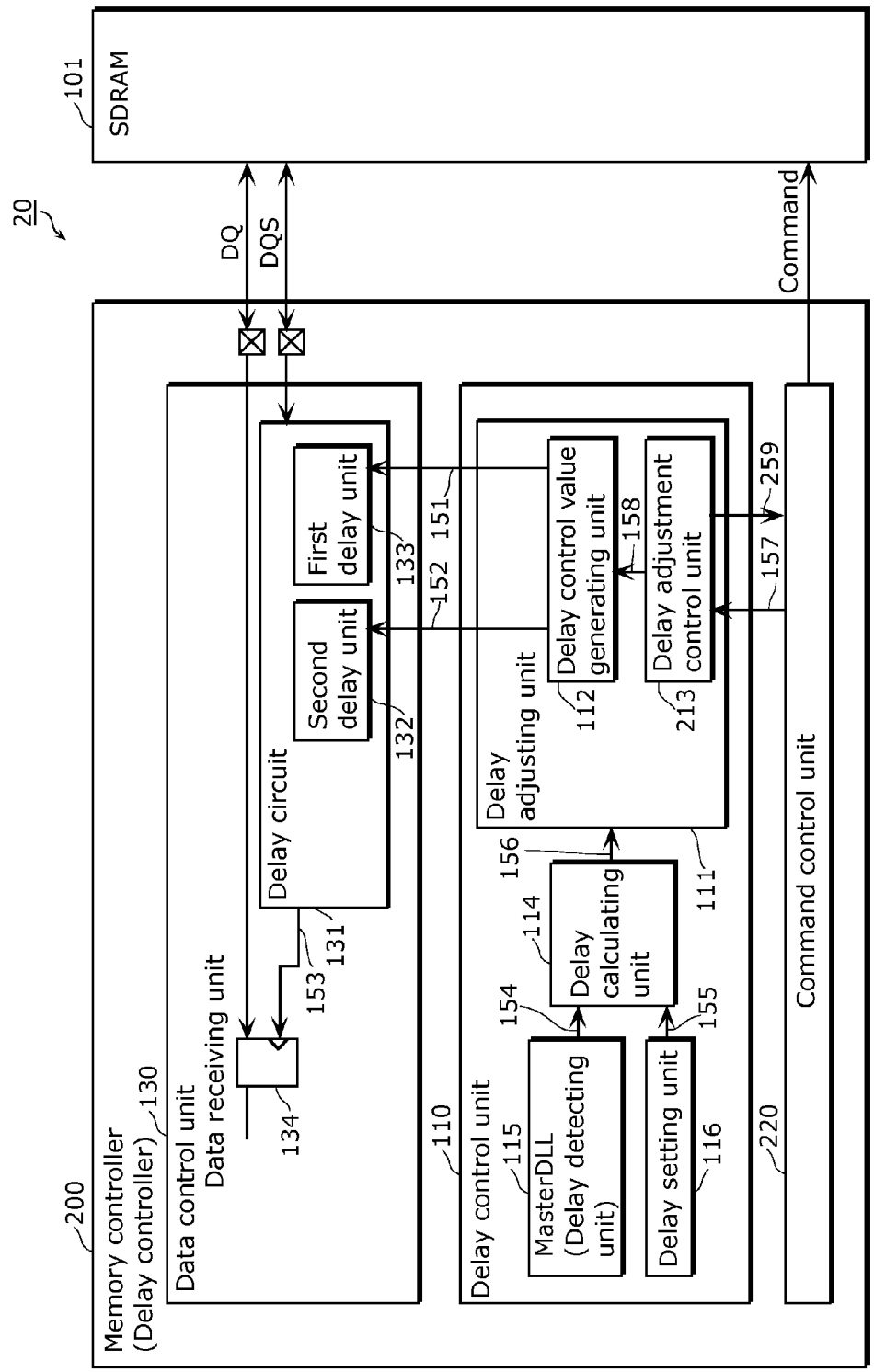
FIG. 7 shows a block diagram of a memory system according to Embodiment 2 of the present disclosure.

FIG. 7 shows a block diagram of a memory system 20 according to Embodiment 2 of the present disclosure. It is noted that the same constitutional features between FIGS. 7 and 1 share the same numerical signs. Mainly described below is how Embodiment 2 differs from Embodiment 1.

A comparison between the memory system 20 in FIG. 7 and the memory system 10 in FIG. 1 shows that functions of a command control unit 220 and a delay adjustment control unit 213 in a memory controller 200 differ from those of the command control unit 120 and the delay adjustment control unit 113 in the memory controller 100.

Specifically, the delay adjustment control unit 213 further outputs a delay update request 259 to the command control unit 220.

Described hereinafter is how the delay adjusting unit 111 works, with reference to FIG. 8.

Figure 8:
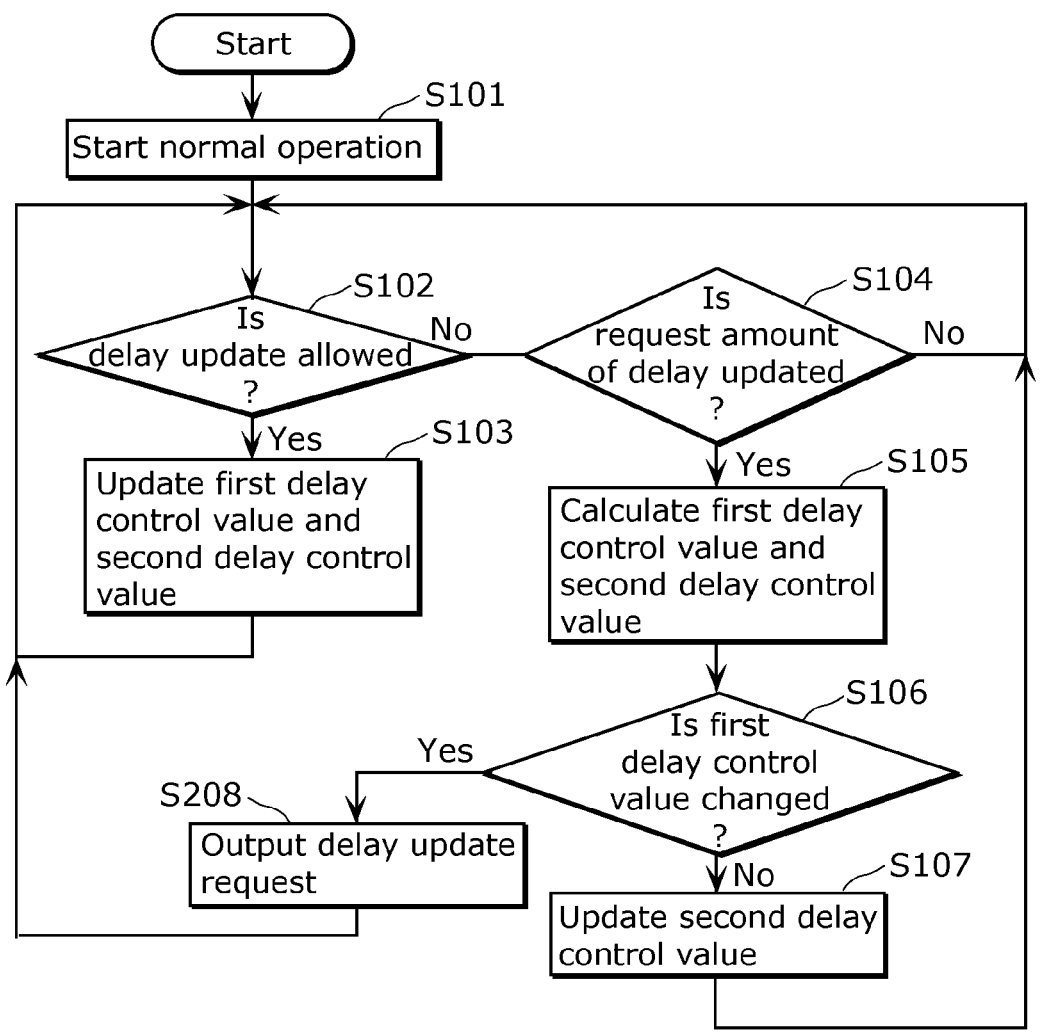
FIG. 8 depicts a flowchart showing an operation of adjusting an amount of delay according to Embodiment 2 of the present disclosure.

FIG. 8 depicts a flowchart showing an operation by the memory controller 200 adjusting an amount of delay. It is noted that, when Step S106 is Yes, the processing in FIG. 8 differs from that in FIG. 3. The other processing is similar to that in FIG. 3.

In the case where a new first delay control value 151 differs from a currently-outputted first delay control value 151 (S106: Yes), the delay adjustment control unit 213 outputs the delay update request 259 to the command control unit 220 (S208). When receiving the delay update request 259, the command control unit 220 stops the currently-executed command. Then, the command control unit 220 outputs the delay update allowance signal 157.

Hence, the delay adjustment control unit 213 receives the delay update allowance signal 157 (S102: Yes), and updates the first delay control value 151 and the second delay control value 152 (S103).

In addition to the features of the memory controller 100 according to Embodiment 1, the memory controller 200 according to Embodiment 2 of the present disclosure further implements a feature that, when the first delay control value 151 is updated in the case where the delay update allowance signal 157 is not outputted (other than the refresh period), the memory controller 200 stops command processing and updates an amount of delay. Hence, the memory controller 200 according to Embodiment 2 of the present disclosure can update amount of delay more often.

Described next is how a delay control value and a delay time actually change, with reference to FIG. 9.

Figure 9:
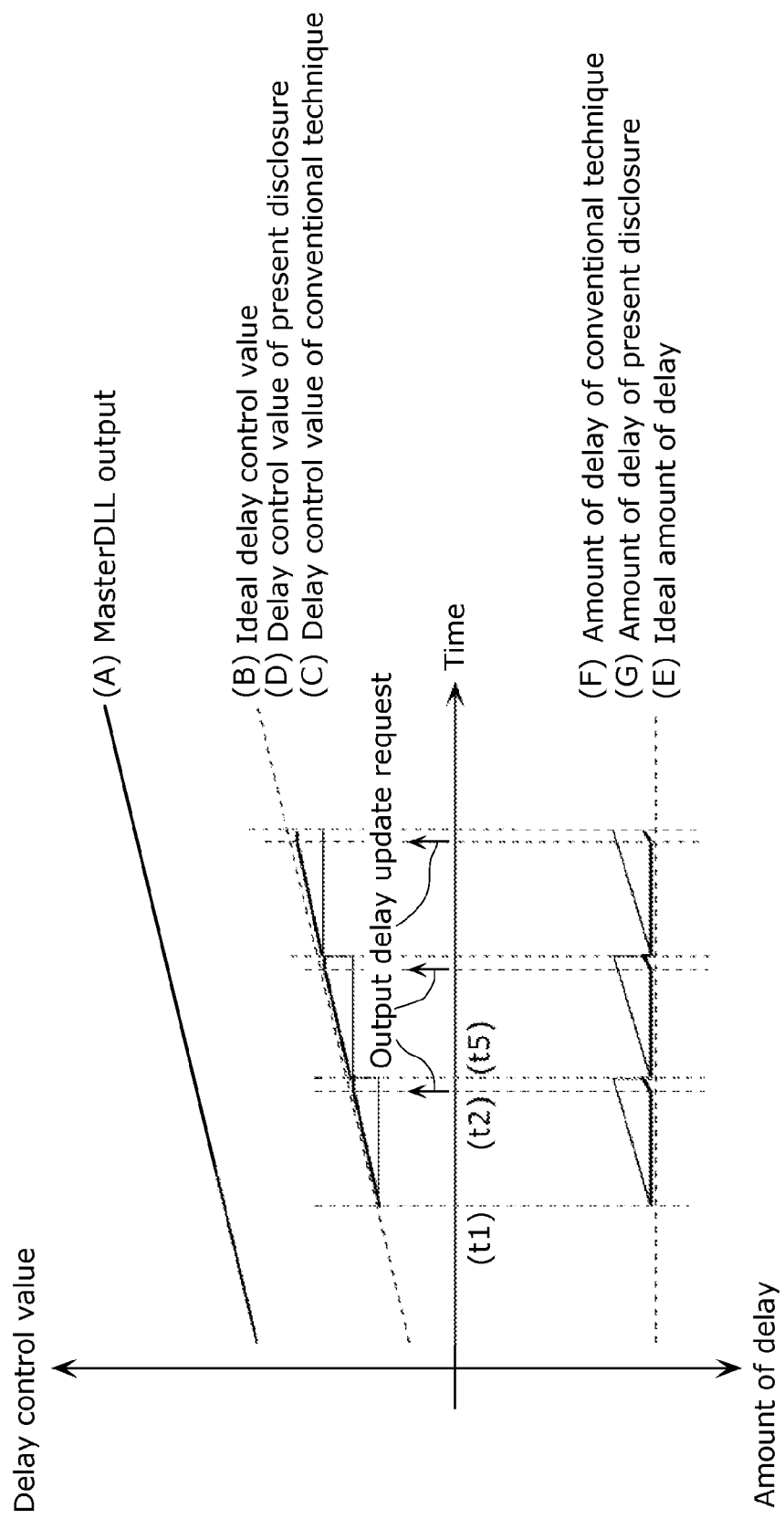
FIG. 9 shows an exemplary operation of a memory controller according to Embodiment 2 of the present disclosure.

FIG. 9 shows an exemplary operation of the memory controller 200 when a voltage rises over time. It is noted that the lines (A) to (G) in FIG. 9 are similar to those in FIG. 4.

When, at the time t2, the ideal delay control value (B) reaches the delay control value for an amount of delay which the second delay unit 132 can adjust, the processing in Step S208 in FIG. 8 is executed and the delay adjustment control unit 213 outputs the delay update request 259. Next, upon receiving the delay update request 259, the command control unit 220 outputs the delay update allowance signal 157 at the time 5. Thus, the processing in Steps S102 and S103 in FIG. 8 allows the delay control value (D) of the present disclosure to match the ideal delay control value (B).

It is noted that described here is the case where the voltage rises over time; however, the memory controller 200 can achieve the above feature when the voltage falls over time. Furthermore, the memory controller 200 can also achieve the above features when the lock value 154 changes due to other reasons, such as a temperature change.

Hence, the memory controller 200 according to Embodiment 2 of the present disclosure causes the delay update request 259 to mandatorily output the delay update allowance signal 157. This allows a delay value to follow a more ideal delay value.

It is noted that, when the first delay control values 151 are different in the determination of the condition in Step S106, Step S209 does not have to be executed immediately; instead, the technique below may be used.

Figure 10:
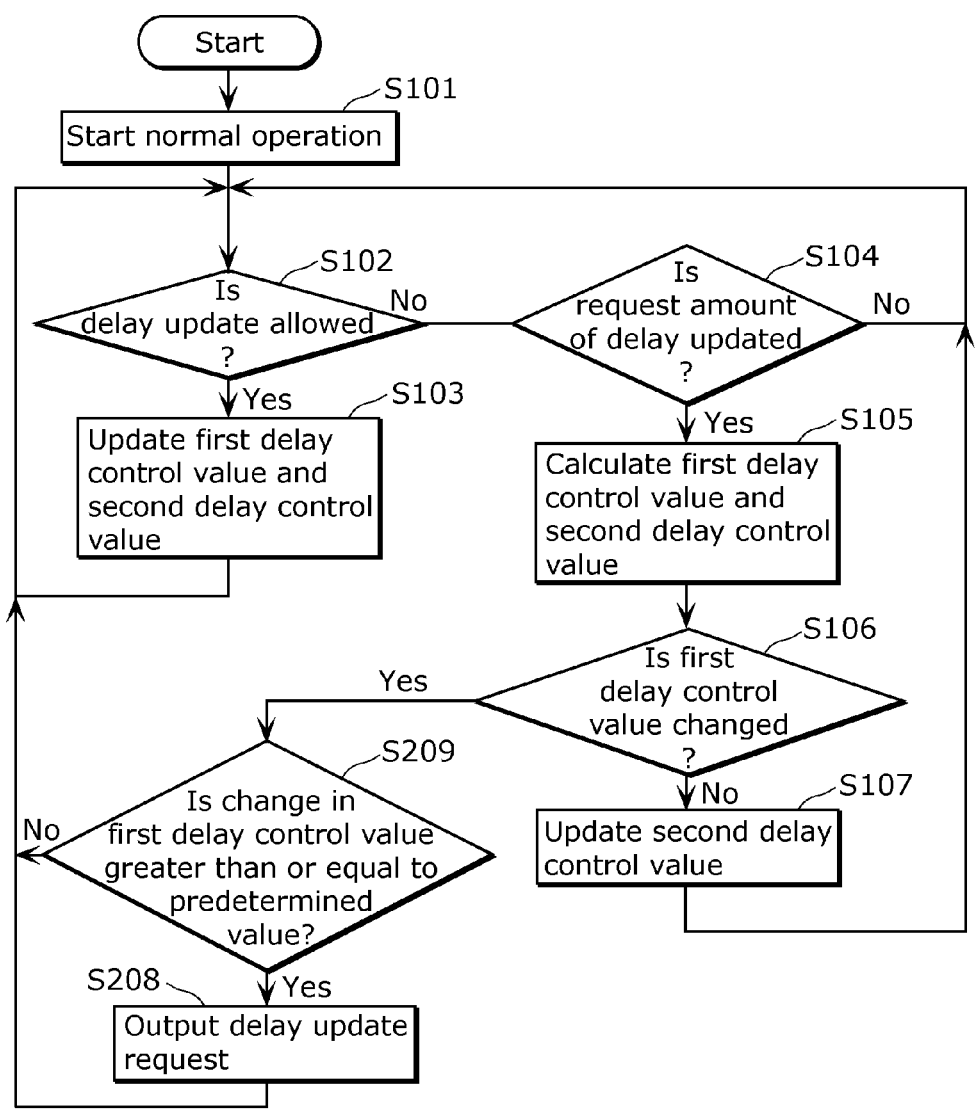
FIG. 10 depicts a flowchart showing a modification of the operation of adjusting an amount of delay according to Embodiment 2 of the present disclosure.

FIG. 10 depicts a flowchart showing a modification of the operation of adjusting an amount of delay by the memory controller 200. It is noted that the processing in FIG. 10 includes the one in FIG. 8 with processing Step S209 added.

Specifically, in the case where a new first delay control value 151 differs from a currently-outputted first delay control value 151 (S106: Yes), the delay adjustment control unit 113 next determines whether not the difference between the new first delay control value 151 obtained in Step S105 and the current first delay control value 151 is equal to or greater than a predetermined value (S209),In the case where the difference between the new first delay control value 151 and the current first delay control value 151 is smaller than the predetermined value (S209: No), the delay adjusting unit 111 does not update the first delay control value 151 and the second delay control value 152, and executes processing from the one in Step S102.

In contrast, in the case where the difference between the new first delay control value 151 and the current first delay control value 151 is greater than or equal to the predetermined value (S209: Yes), the delay adjustment control unit 213 next outputs the delay update request 259 to the command control unit 220 (S208).

Such a feature makes it possible to output the delay update requests 259 less often.

Moreover, when the delay update request 259 is outputted, the command control unit 220 can output the delay update allowance signal 157 while issuing a refresh command. In addition, when the data control unit 130 includes a data transmitting unit and a data receiving unit, a delay update allowance signal 157 for the data transmitting unit may be separated from another delay update allowance signal 157 for the data receiving unit. Then, with different timing, the delay adjusting unit 111 may separately control delay adjustment for the data transmitting unit and delay adjustment for the data receiving unit.

Furthermore, the above data transfer is executed with the source synchronous scheme; however, the present disclosure shall not be limited to this. The present disclosure may be applied to all the systems that require the adjustment of an amount of delay.

Each of the processing units included in the memory systems and 20 according to Embodiments 1 and 2 are typically implemented in a form of large-scale integrations (LSIs), or integrated circuits. The processing units may be made as separate individual chips, or as a single chip to include a part or all thereof.

The means for circuit integration is not limited to the LSI, and implementation in the form of a dedicated circuit or a general-purpose processor is also available. It is also acceptable to use a Field Programmable Gate Array (FPGA) that is programmable after the LSI has been manufactured, and a reconfigurable processor in which connections and settings of circuit cells within the LSI are reconfigurable.

Part of the functions of the memory systems 10 and 20 according to Embodiments 1 and 2 of the present disclosure may be implemented by a processor, such as a CPU, executing a program.

The present disclosure may also include the above program and a recording medium on which the program is recorded. As a matter of course, the above program may be distributed via a transmission medium such as the Internet.

At least part of the functions of the memory system according to Embodiments 1 and 2 and the modifications thereof may be combined.

All the numerical values used above are exemplary ones to specifically describe the present disclosure. Thus, the present disclosure shall not be defined by the exemplary numerical values. Moreover, the logic levels shown in high and low ("1" and "0") or the switching statuses shown in on and off are examples to specifically describe the present disclosure. A different combination of the exemplary logic levels or switching statuses can obtain similar results.

The present disclosure may be implemented not only as the above memory system, but also as a memory controller or a delay circuit included in the memory system. The present disclosure may also be implemented as an information terminal including the memory system.

The orders of the above-described steps are exemplary ones to specifically describe the present disclosure. Thus, orders other than the above may be employed. Moreover, part of the steps may simultaneously (in parallel) be executed along with another step.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

As described above, the present disclosure is applicable to a delay circuit, a delay controller, a memory controller, and a memory system. Moreover, the present disclosure is applicable to a cellular phone, a personal computer, and an information terminal such as a handheld terminal, all of which include the memory system.

The invention claimed is:

1. A delay controller comprising:
a delay circuit comprising
a first delay unit and a second delay unit connected in series and configured to delay an input signal to generate a delayed signal,
wherein the first delay unit includes a first signaling pathway, and is configured to change, based on a first delay control signal, a first amount of delay to be provided to the input signal by switching signaling pathways for transmitting the input signal that are within the first pathway, and
the second delay unit includes a second signaling pathway, and is configured to (i) provide to the input signal an amount of delay which is a sum of a predetermined delay value and a second amount of delay, and (ii) change the second amount of delay based on a second delay control signal without switching the second signaling pathway for transmitting the input signal;
a delay adjusting unit configured to generate the first delay control signal and the second delay control signal; and
a processing unit configured to execute processing using the delayed signal generated by the delay circuit,
wherein the delay adjusting unit is configured to:
update the first amount of delay and the second amount of delay by updating the first delay control signal and the second delay control signal in an invalid duration in which the processing unit does not execute the processing using the delayed signal; and
update the second amount of delay by updating the second delay control signal in a valid duration in which the processing unit executes the processing using the delayed signal.

2. The delay controller according to claim 1,
wherein, in the valid duration, the delay adjusting unit is configured to update the second delay control signal for a predetermined time interval.

3. The delay controller according to claim 1, further comprising
a delay detecting unit configured to detect a reference amount of delay which is an index of an amount of delay observed under a current operating environment of the delay controller,
wherein, based on the reference amount of delay, the delay adjusting unit is configured to generate the first delay control signal and the second delay control signal.

4. The delay controller according to claim 3,
wherein the delay adjusting unit is configured to update the second delay control signal in the case where a difference between a new reference amount of delay detected by the delay detecting unit and an immediately preceding reference amount of delay detected when the second delay control signal is updated is greater than a predetermined value in the valid duration, the new reference amount of delay and the immediately preceding reference amount of delay being included in the reference amount of delay.

5. The delay controller according to claim 3,
wherein, in the valid duration, the delay adjusting unit is configured to:
calculate a new first delay control signal and a new second delay control signal based on a new reference amount of delay detected by the delay detecting unit, the new first delay control signal being included in the first delay control signal, the new second delay control signal being included in the second delay control signal, and the new reference amount of delay being included in the reference amount of delay;
update the second amount of delay by outputting the new second delay control signal to the second delay unit, in the case where the new first delay control signal is same as a current first delay control signal included in the first delay control signal; and
leave the first amount of delay and the second amount of delay un-updated, in the case where the new first delay control signal is different from the current first delay control signal.

6. The delay controller according to claim 3,
wherein, in the valid duration, the delay adjusting unit is configured to:
calculate a new first delay control signal and a new second delay control signal based on a new reference amount of delay detected by the delay detecting unit, the new first delay control signal being included in the first delay control signal, the new second delay control signal being included in the second delay control signal, and the new reference amount of delay being included in the reference amount of delay;

update the second amount of delay by outputting the new second delay control signal to the second delay unit, in the case where the new first delay control signal is same as a current first delay control signal included in the first delay control signal; and update the first delay control signal and the second delay control signal whereas causing the processing unit not to execute the processing using the delayed signal, in the case where the new first delay control signal is different from the current first delay control signal.

7. The delay controller according to claim 6, wherein, in the valid duration, the delay adjusting unit is configured to update the first delay control signal and the second delay control signal whereas causing the processing unit not to execute the processing using the delayed signal, in the case where a difference between the new first delay control signal and the current first delay control signal is greater than or equal to a predetermined value.

8. A memory controller which reads data from a memory, the memory controller comprising the delay controller according to claim 3, wherein the input signal is a strobe signal to be outputted from the memory, and the processing unit is configured to retrieve data to be outputted from the memory using the delayed signal.

9. An information terminal comprising:

a memory; and the memory controller which reads the data from the memory, according to claim 8.

* * * * *